(12) United States Patent
Reimund

(10) Patent No.: US 8,107,244 B2
(45) Date of Patent: Jan. 31, 2012

(54) CONNECTING A PLURALITY OF CHASSIS USING A RIGID CONNECTION

(75) Inventor: James A. Reimund, Georgetown, TX (US)

(73) Assignee: National Instruments Corporation, Austin, TX (US)

( * ) Notice: Subject to any disclaimer, the term of this patent is extended or adjusted under 35 U.S.C. 154(b) by 513 days.

(21) Appl. No.: 12/341,549

(22) Filed: Dec. 22, 2008

(65) Prior Publication Data

US 2010/0157546 A1    Jun. 24, 2010

(51) Int. Cl.
    *H05K 7/00*    (2006.01)
(52) U.S. Cl. ......................................................... 361/729
(58) Field of Classification Search .................... 361/729
    See application file for complete search history.

(56) References Cited

U.S. PATENT DOCUMENTS

| | | | | |
|---|---|---|---|---|
| 4,237,546 A * | 12/1980 | Wells | | 710/100 |
| 4,477,862 A * | 10/1984 | Gonzales | | 361/679.32 |
| 5,648,891 A * | 7/1997 | Gierut | | 361/788 |
| 5,966,292 A * | 10/1999 | Amberg et al. | | 361/733 |
| 6,157,534 A * | 12/2000 | Gallagher et al. | | 361/724 |
| 6,394,815 B1 * | 5/2002 | Sarno et al. | | 439/61 |
| 6,456,495 B1 * | 9/2002 | Wieloch et al. | | 361/729 |
| 6,496,376 B1 * | 12/2002 | Plunkett et al. | | 361/729 |
| 6,608,755 B2 * | 8/2003 | Baldwin et al. | | 361/729 |
| 6,724,636 B2 * | 4/2004 | Yamamoto et al. | | 361/747 |
| 6,795,318 B2 * | 9/2004 | Haas et al. | | 361/729 |
| 6,795,885 B1 * | 9/2004 | deBlanc et al. | | 710/305 |
| 6,848,913 B2 * | 2/2005 | Wang | | 439/65 |
| 7,239,528 B1 * | 7/2007 | McLeod | | 361/796 |
| 7,275,935 B2 * | 10/2007 | Chen et al. | | 439/61 |
| 7,295,446 B2 * | 11/2007 | Crippen et al. | | 361/788 |
| 7,460,170 B2 | 12/2008 | Gardiner et al. | | |
| 7,466,561 B2 | 12/2008 | Dean | | |
| 7,623,356 B2 * | 11/2009 | Leigh et al. | | 361/788 |
| 7,731,523 B2 * | 6/2010 | Helmreich | | 439/510 |
| 2004/0196727 A1 | 10/2004 | Garnett et al. | | |
| 2005/0002166 A1 * | 1/2005 | Clidaras et al. | | 361/735 |
| 2006/0256534 A1 | 11/2006 | Garnett et al. | | |
| 2008/0101049 A1 * | 5/2008 | Casto et al. | | 361/788 |

\* cited by examiner

*Primary Examiner* — Lisa Lea Edmonds
(74) *Attorney, Agent, or Firm* — Meyertons, Hood, Kivlin, Kowert & Goetzel, P.C.; Jeffrey C. Hood; Joel L. Stevens

(57) ABSTRACT

Connecting a plurality of chassis using a rigid connection. A first coupling element of a first chassis may be mated with a first rigid connection. The first coupling element may be positioned on an exterior housing of the first chassis. A second coupling element of a second chassis may be mated with the first rigid connection. The second coupling element may be positioned on an exterior housing of the second chassis. Connecting the first chassis and the second chassis may allow the first and second chassis to communicate.

21 Claims, 4 Drawing Sheets

CONNECTING A PLURALITY OF CHASSIS USING A RIGID CONNECTION

FIELD OF THE INVENTION

The present invention relates to the field of computer systems, e.g., switching systems, and more particularly to a system and method for connecting a plurality of chassis using a rigid connection.

DESCRIPTION OF THE RELATED ART

In recent years, chassis for computer systems have become increasingly popular. In particular, chassis are particularly useful for test and measurement and industrial applications. Typical chassis include a plurality of slots for inserting expansion cards, e.g., for interacting with or controlling various instruments or devices. However, once all of these slots are used, another chassis may be necessary. To address this problem, some previous systems included the ability to couple different chassis together using communication cables. However, such cables require hand wiring (which can result in misconfiguration) and can become tangled. Additionally, cable solutions often introduce latency and signal degradation issues. Thus, improvements in chassis connections are desired.

SUMMARY OF THE INVENTION

Various embodiments are presented of a system and method for connecting a plurality of chassis using a rigid connection.

The system may include a first chassis, a second chassis, and/or a third chassis, e.g., up to n chassis.

The first chassis may include a housing defining one or more slots. The housing may include an exterior. The first chassis may further include a first backplane included in the housing. The first backplane may be configured to receive one or more cards in the one or more slots.

The first chassis may also include a first coupling element positioned or included on the exterior of the housing. The first coupling element may be electrically coupled to the first backplane. The first coupling element may also be configured to mate with a first rigid connection in order to convey communication through the first rigid connection between the first backplane of the first chassis and a second backplane of a second chassis (e.g., via a coupling element ("second coupling element") of the second chassis). Similar to above, the second chassis may include a housing defining one or more slots and including an exterior. The second chassis may also include a second backplane included in the housing which may also be configured to receive one or more cards in one or more slots. Thus, the first and second chassis may be physically distinct with respect to each other.

In some embodiments, the first rigid connector comprises a circuit board, e.g., a printed circuit board. Thus, the first rigid connector may be configured to mate with the first coupling element of the first chassis and mate with the second coupling element of the second chassis. After connection, the rigid connection may be configured to convey communication between the first backplane of the first chassis and the second backplane of the second chassis. In one embodiment, the rigid connection may be configured to convey bus signals between the first backplane and the second backplane. For example, the rigid connection may be configured to convey analog bus signals between the first and second backplane.

The first chassis may further include another coupling element ("third coupling element"). Similar to above, the third coupling element may be positioned or included on the exterior of the housing and may be electrically coupled to the first backplane. The third coupling element may be configured to mate with a second rigid connection in order to convey communication through the second rigid connection between the first backplane of the first chassis and a third backplane of the third chassis. The second rigid connection may mate or connect with a coupling element of the third chassis ("fourth coupling element"). Similar to above, the third chassis may include a housing defining one or more slots and including an exterior. The third chassis may also include a third backplane included in the housing which may also be configured to receive one or more cards in one or more slots. Thus, the first and third chassis may be physically distinct with respect to each other.

The method for coupling a plurality of chassis may include mating the first coupling element of the first chassis with the first rigid connection. The method may further include mating the second coupling element of the second chassis with the first rigid connection. As indicated above, connecting the first chassis and the second chassis allows the first and second chassis to communicate. Additionally, the first backplane and the second backplane may communicate (e.g., analog bus signals) over the first rigid connector.

The method may further include mating the third coupling element of the first chassis with a second rigid connection. Furthermore, the fourth coupling element of the third chassis may be mated with the second rigid connection. Connecting the first chassis and the third chassis may allow the first and third chassis to communicate. Additionally, connecting the first chassis and the third chassis allows the first, second, and third chassis to communicate.

BRIEF DESCRIPTION OF THE DRAWINGS

A better understanding of the present invention can be obtained when the following detailed description of the preferred embodiment is considered in conjunction with the following drawings, in which.

Figure 1:
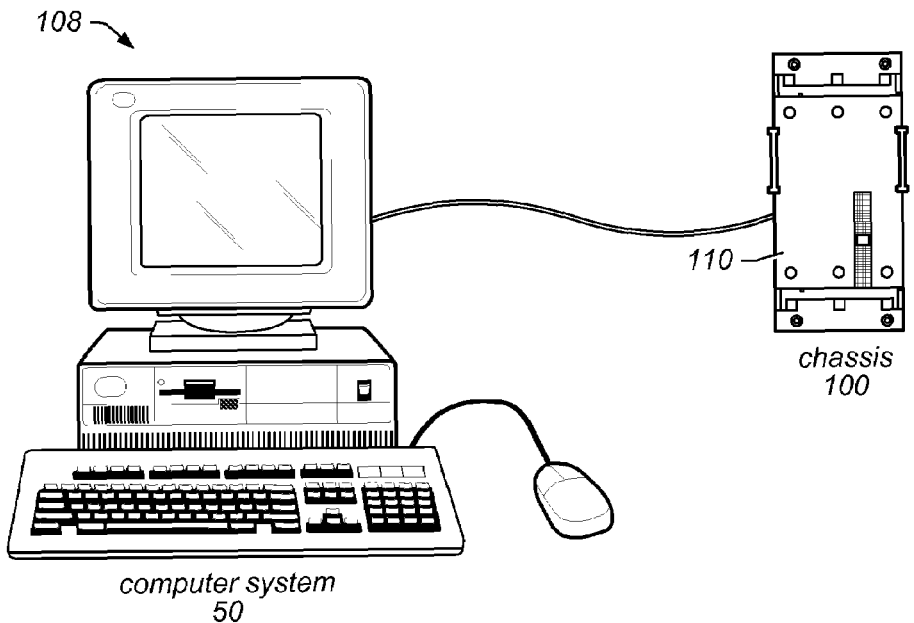
FIG. 1 illustrates a computer system coupled to a chassis according to an embodiment of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

FIG. 1—Computer System Coupled to a Chassis

FIG. 1 illustrates a computer system 50 that is coupled to chassis 100. As shown in FIG. 1, the computer system 50 may include a display device operable to display a program (e.g., a graphical user interface to the program) as the program is created and/or executed as well as various input devices. The graphical user interface may comprise any type of graphical user interface, e.g., depending on the computing platform.

The computer system 50 may include at least one memory medium on which one or more computer programs or software components according to one embodiment of the present invention may be stored. The memory medium may also store operating system software, as well as other software for operation of the computer system.

As also shown, the chassis 100 may include a backplane 110. In some embodiments, the backplane 110 may include a configurable hardware unit, such as a field programmable gate array (FPGA), which may be usable for configuring the chassis 100 to perform one or more functions (e.g., using a subset or all of a plurality of cards inserted into the chassis).

As indicated, the chassis 100 may also include one or more (e.g., a plurality of) slots which may be configured to receive a corresponding plurality of pluggable cards. In one embodiment, the chassis 100 may include a fixed number of slots, e.g., 4 slots, 8 slots, etc. For example, the cards may be any of various types, e.g., cards for controlling or interacting with instruments or devices, I/O cards for receiving and/or manipulating data, computer cards (e.g., including a processor and memory medium or configurable hardware unit) which may be configured to perform computational functions, and/or other types of cards, as desired. One or more of the plurality of cards may include a configurable hardware element which may be configured to perform one or more functions.

The backplane 110 may provide one or more busses for communicating with (and between) the plurality of cards. In one embodiment, the bus may be an analog bus, e.g., which may be able to communicate test signals, although other busses are envisioned. The computer system 50 may be usable to configure and/or control the chassis 100. For example, the computer system 50 may be used to configure one or more of the cards inserted in the chassis 100. In further embodiments, as indicated above, the backplane 110 of the chassis 100 may include a configurable hardware unit (e.g., an FPGA), and the computer system 50 may be usable to configure the configurable hardware unit (e.g., with a graphical program, such as one created using LabVIEW® provided by National Instruments Corporation). Thus, the computer system 50 may be usable to control or configure the chassis 100 to perform one or more functions (e.g., industrial or measurement functions).

Embodiments of the present invention may be involved with performing test and/or measurement functions; controlling and/or modeling instrumentation or industrial automation hardware; modeling and simulation functions, e.g., modeling or simulating a device or product being developed or tested, etc.

FIGS. 2A-2D—Two Coupled Chassis via a Rigid Connection

Figure 2A:
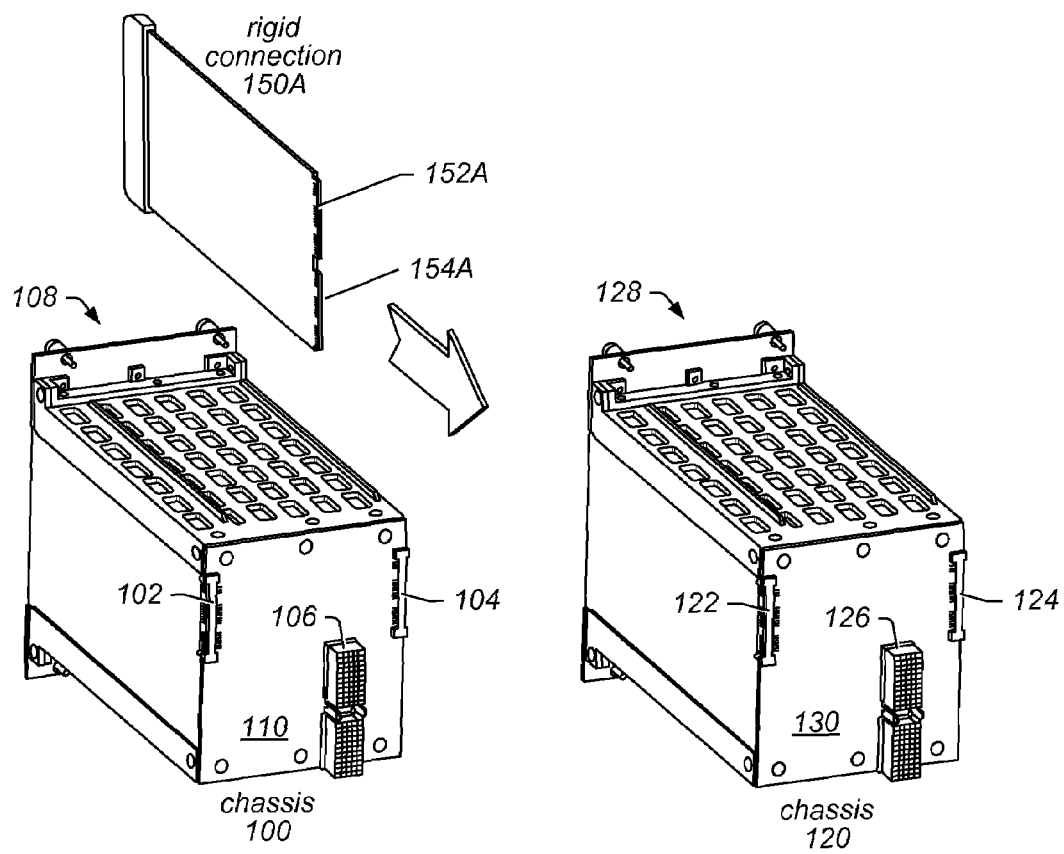
FIGS. 2A, 2B, and 2C illustrate a system comprising two chassis coupled to each other according to an embodiment of the present invention.
Figure 2B:
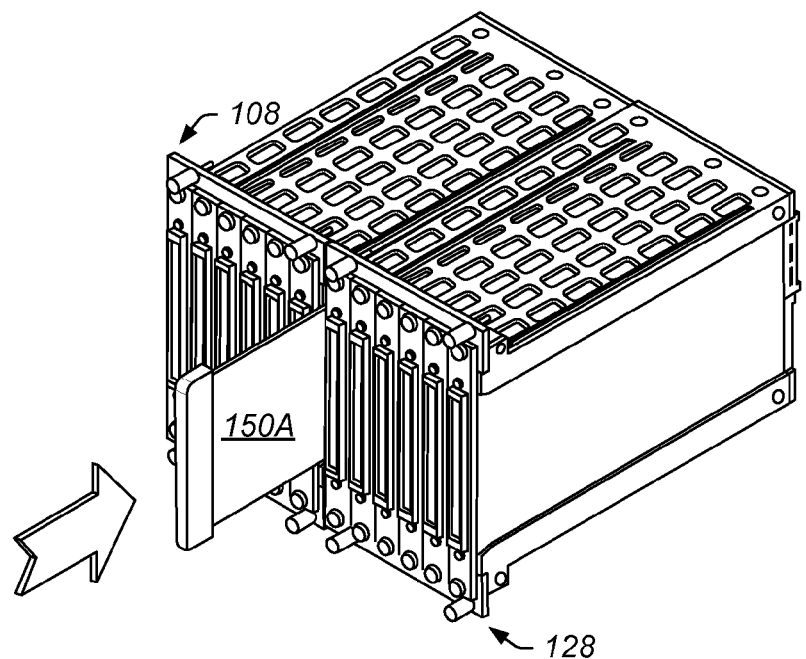
Figure 2C:
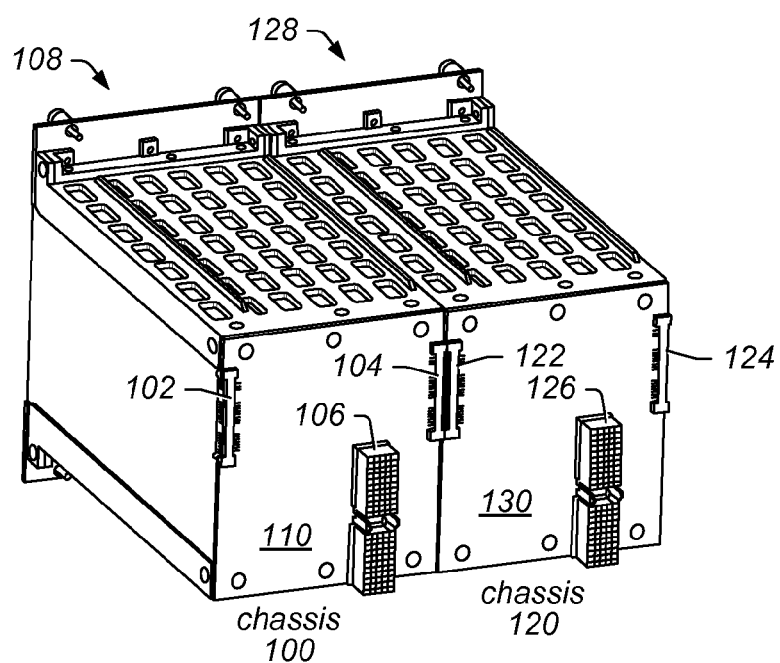
Figure 2D:
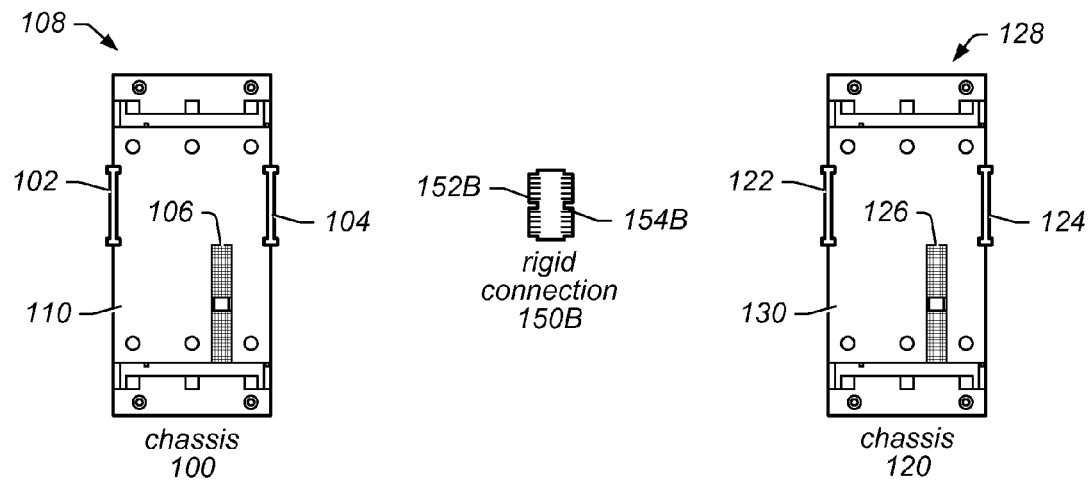
FIG. 2D illustrates an alternate embodiment for coupling two chassis to each other.

As shown in FIGS. 2A-2C, the chassis 100 may be configured to couple to a second chassis 120 via a rigid connection 150A.

More specifically, as shown in FIG. 2A, the chassis 100 may include a first coupling element 102 and a second coupling element 104. The chassis 100 may also include a communication or physical interface 106, e.g., for connecting to a larger housing (e.g., the housing shown in FIG. 3).

As shown, the chassis 100 may include a front 108. The front 108 may provide an outlet for interfaces of the plurality of cards inserted into the chassis. For example, various ports for ones of the plurality of cards may be presented on the front 108 for coupling to other devices or computer systems (e.g., the computer system 50 of FIG. 1).

Similarly, the chassis 120 may include a first coupling element 122 and a second coupling element 124 as well as a communication or physical interface 126. Also similar to the chassis 100, the chassis 120 may include a front 128 and a backplane 130.

As also shown, a rigid connection 150A may be configured to mate with the coupling elements of the chassis 100 and 120. As used herein, "mate" or "mating" refers to direct physical connection of coupling elements between two objects. For example, the rigid connection 150A may be configured to mate with the coupling element 104 of the first chassis and the coupling element 122 of the second chassis to couple the two chassis. In one embodiment, the coupling elements 104 and 122 of the chassis 100 and 120 may be half-connectors which may form a connector for mating to the mating portion 152A of the rigid connection 150A (i.e., to form a full mated connection). However, it should be noted that other "matings" are envisioned, e.g., ones which may include a male coupling element and a female coupling element.

In general, the rigid connection may provide a short connection between the two backplanes, thereby avoiding tangling problems, latency issues (due to length of the connection between the chassis), and signal degradation issues presented by prior art cable connections. As used here "short" may refer to a distance between the chassis of 1", 2", 3" or similar (e.g., shorter) distances. Longer distances (e.g., 5") may also be used in other embodiments. However, it should be noted that in the embodiments shown in FIGS. 2A-2C, the distance may be the thickness of a single printed circuit board. Note that the rigid connection does not refer to typical cables, such as those used in prior art systems for coupling two chassis.

The rigid connection may be configured to convey communication (e.g., bus signals, such as analog bus signals, or other types of communication or data signals) between the chassis 100 and the chassis 120. In some embodiments, the rigid connection may provide a direct connection of signals between the chassis 100 and the chassis 120. However, in one embodiment, the rigid connection may include circuitry or logic which may be configured (or configurable) to perform one or more functions, e.g., signal processing functions. Additionally, the rigid connection may be usable for accessing backplane signals or measuring various characteristics of signals being passed between the chassis 100 and the chassis 120, e.g. with digital multimeter (DMM).

In some embodiments, the rigid connection may be a circuit board, e.g., a printed circuit board (PCB). For example, the rigid connection may be a printed circuit board with edge traces or pins used for mating with the coupling elements of the chassis. More specifically, as shown, the rigid connection may include mating portions 152A and 154A (shown as including edge traces). In this particular embodiment, mating portion 152A may mate with coupling element 104 of the chassis 100 and coupling element 122 of the chassis 120. In the embodiment shown, mating portion 154A may not be used, e.g. may be short-circuited. However, in some embodiments, one or both of the coupling elements 104 and 122 may be positioned on their respective backplanes such that they may mate with mating portion 154A of the rigid connection 150A. Alternatively, the coupling elements 104 and 122 may be extended such that both mating portions 152A and 154A are used to couple the chassis 100 and 120 together. In further embodiments, the rigid connection 150A may be symmetric, and may be usable for two or more different types of chassis, e.g., a first type of chassis which mates with mating portion 152A (due to the location of the coupling elements on the chassis) or a second type of chassis that mates with mating portion 154A. As indicated above, the circuit board may have circuit portions for performing various functions on the signals being passed between the chassis 100 and the chassis 120. However, in alternate embodiments, the rigid connection 150A may simply provide a straight path between the chassis 100 and the chassis 120, e.g., on the mating portion 152A and/or 154A.

Note however, that other styles of mating portions and coupling elements are envisioned. For example, while in the embodiment shown in FIGS. 2A-2C the coupling elements (102, 104, 122, 124) may be half-connectors (e.g., which may be neither male nor female) and the rigid connection (150A) may have edge traces (152A, 154A) which couple to the half-connectors, other configurations and types of connectors are envisioned. For example, in the embodiment shown in FIG. 2D, the coupling elements (102, 104, 122, 124) may be "female" coupling elements and the rigid connection 150B may have "male" coupling portions (152B and 154B), or these may be reversed or rearranged in any desirable configuration. As another example, the coupling element 104 could be male, the mating portion 152B could be female, the mating portion 154B could be male, and the coupling element 122 could be female, in one possible configuration.

In one embodiment, instead of a separate rigid connection, each coupling element may be half of the connection (e.g., where coupling element 104 may be male and coupling element 122 may be female). Thus, in this embodiment, the two coupling elements may form a rigid connection (without requiring the rigid connections 150A or 150B). In other embodiments, the rigid connection may be any type of connection that is substantially inflexible and capable of connecting the two chassis, e.g., in an electrical manner. For example, the rigid connection may include hard plastic materials as well as electrical connections.

FIG. 2B illustrates the chassis 100 and the chassis 120 while being connected using the rigid connection 150A. More specifically, as shown, the rigid connection 150A is being inserted between the chassis (from the front 108, 128) to mate with the coupling elements 104 and 122 (not shown). FIG. 2C shows the chassis 100 and the chassis 120 coupled via the rigid connection 150A after the insertion of FIG. 2B. Note that while the chassis 100 and the chassis 120 are shown as being similar or identical, they may still be able to couple when different. For example, in one embodiment, the chassis 100 may be a 4 slot chassis and the chassis 120 may be an 8 slot chassis. Thus, combining the two chassis may effectively create a 12 slot chassis.

Figure 3:
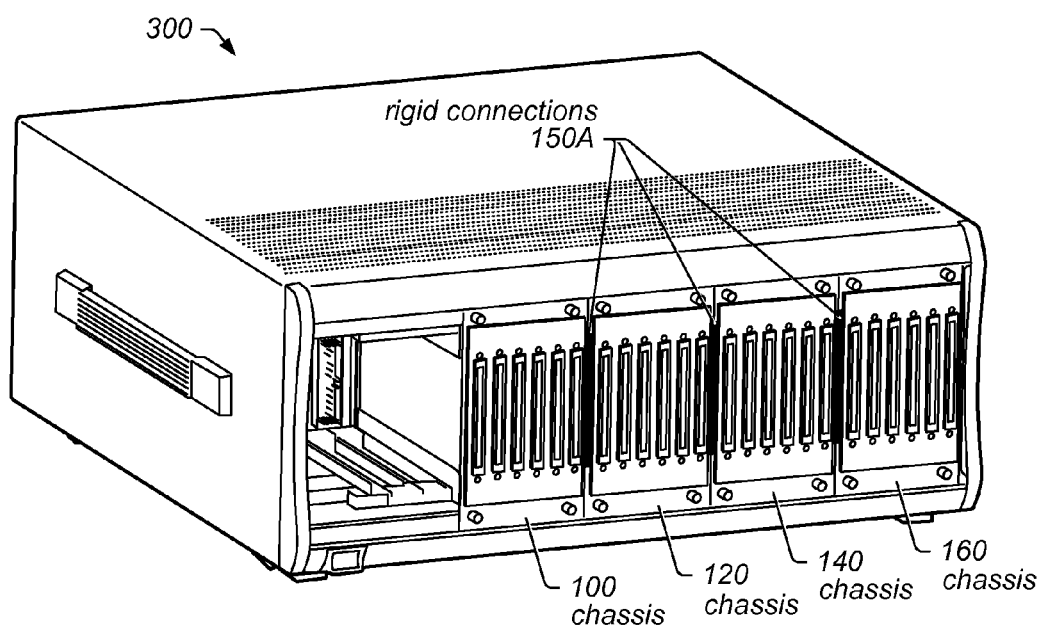
FIG. 3 illustrates a plurality of coupled chassis according to one embodiment of the invention.

FIG. 3—Plurality of Connected Chassis in a Larger Housing

FIG. 3 illustrates a large housing 300 which includes a plurality of connected chassis (e.g., as connected in the embodiments of FIGS. 2A and 2B). More specifically, the larger housing 300 includes chassis 100, chassis 120, chassis 140, and chassis 160. In this illustration, the fronts of the chassis (100, 120, 140, 160) are shown, and the backplanes for these chassis are hidden from view inside the large housing 300.

As shown, the larger housing 300 may include an available portion for a fifth chassis, as desired. However, the larger housing, or coupling the chassis in general, may not be limited to 4 or 5 connections, but may be extendable to, for example, 8 chassis or, in some embodiments, any number of chassis.

In an alternate embodiment, the large housing 300 may itself be a chassis, e.g. a PXI chassis or PXI express chassis. In this embodiment, chassis 100, 120, 140, and 160 may be sub-chassis of the chassis 300. In some embodiments, each of these sub-chassis may connect to a backplane of the chassis 300 (e.g., via communication interface 106). Thus, the chassis 300 may have a backplane (e.g., for PXI, PXI express, USB, or other bus signals). Additionally, as indicated above, each sub-chassis may include backplanes themselves (e.g., for analog bus signals such as testing signals), which may be connected as disclosed herein. Thus, the backplanes of the sub-chassis (100, 120, 140, 160) may be coupled as described herein while they themselves are connected a backplane of the chassis 300. However, in alternate embodiments, the sub-chassis busses may be any of a variety of busses and the large housing 300 may not have its own backplane.

Note that in some embodiments the coupled chassis or sub-chassis may be connected directly to a computer system (e.g. computer system 50), as shown in FIG. 1. However in other embodiments the coupled chassis or sub-chassis may not be capable of connecting directly to a computer system, e.g. may instead connect to the large housing 300. As noted above, the large housing 300 may itself be a chassis which may be connected to a computer system (e.g. computer system 50). Thus, the coupled chassis or sub-chassis may be able to connect to a computer system through the large housing 300.

Figure 4:
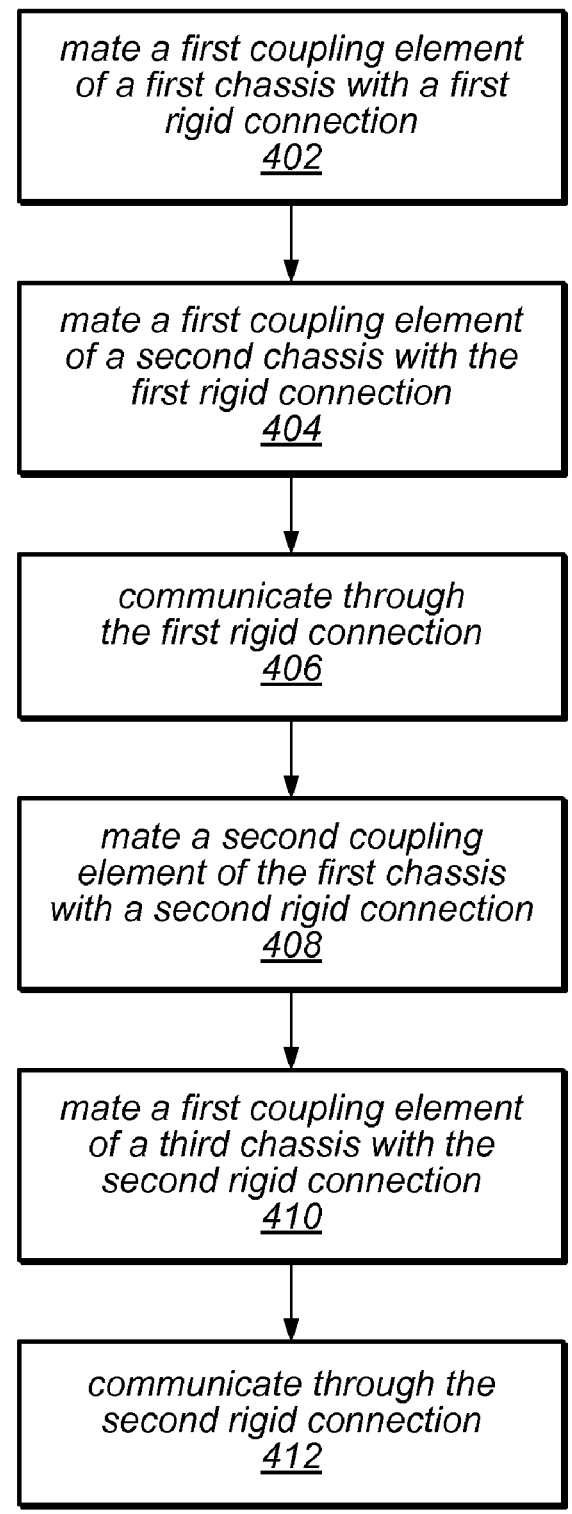
FIG. 4 is a flowchart diagram illustrating one embodiment of a method for connecting a plurality of chassis using a rigid connection.

FIG. 4—Method for Connecting a Plurality of Chassis Using a Rigid Connection

FIG. 4 illustrates a method for connecting a plurality of chassis using a rigid connection. The method shown in FIG. 4 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 402, a first coupling element of a first chassis may be mated with a first rigid connection. Similar to depictions above of the chassis 100, the first coupling element (e.g., coupling element 104) may be positioned on an exterior housing of the first chassis and may mate with the first rigid connection (e.g., rigid connections 150A or 150B via mating portions 152A or 152B). As indicated above, the first rigid connection may be a circuit board (e.g., a printed circuit board) which may be usable to electrically couple a backplane of the first chassis to a backplane of another chassis.

In 404, a first coupling element of a second chassis may be mated with the first rigid connection. Similar to depictions above of the chassis 120, the first coupling element of the second chassis (e.g., coupling element 122) may be positioned on an exterior housing of the second chassis and may mate with the first rigid connection (e.g., mating portions 152A or 154B of the rigid connections 150A or 150B).

Thus, the first chassis and the second chassis may be rigidly connected using the rigid connection. More specifically, in one embodiment, the rigid connection may provide electrical connectivity between the backplane of the first chassis and the backplane of the second chassis. Additionally, as indicated above, the rigid connection may include circuitry or logic which may perform signal processing on signals passed between the first and second chassis. In one embodiment, the rigid connection may provide an access point for backplane signals, e.g., for testing, possibly using a DMM.

In 406, communication may be performed between the first chassis and the second chassis via the rigid connection. In one embodiment, communicating may include transmitting one or more bus signals, e.g. analog bus signals, over the rigid connection. Thus, for example, bus signals may be transmitted from the first chassis backplane to the second chassis backplane. However, it should be noted that signals other than (or in addition to) bus signals are envisioned. For example, timing signals, data signals, and/or other types of signals may be transmitted across the rigid connection (e.g., from the first chassis to the second chassis, or vice versa).

In 408, a second coupling element of the first chassis may be mated with a second rigid connection. The second coupling element (e.g., coupling element 102) may be positioned on the exterior housing of the first chassis. The second rigid connection may be similar to or different from the first rigid connection described above, in various embodiments. Additionally, similar to above, the second rigid connection may include logic or circuitry (and/or embedded passive devices) for performing signal processing and/or may provide an access point for intercepting or otherwise receiving backplane signals.

In 410, a first coupling element of a third chassis may be mated with the second rigid connection. Similar to above, the first coupling element of the third chassis may be positioned on the exterior housing of the third chassis. Thus, the first chassis and the third chassis may be coupled (e.g., electrically) using the second rigid connection.

In 412, communication may be performed between the first chassis and the third chassis via the second rigid connection. Similar to above, the communication between the first chassis and the third chassis may include bus signals, e.g. analog bus signals, and/or any other types of signals, as desired. Note that connecting the third chassis and the first chassis may allow communication to occur between the second chassis and the third chassis (with the first chassis in between). Thus, as one example, signals may be passed from the second chassis to the first chassis (via the first rigid connection) and then from the first chassis to the third chassis (via the second rigid connection).

However, it should be noted that in some embodiments, communication between the first chassis and the second chassis (using the first rigid connection) may be separate or distinct from communication between the first chassis and the third chassis (using the second rigid connection). More specifically, in one embodiment, lines of communication between the first and second chassis may be independent from lines of communication between the first and third chassis. However, as already indicated, in alternate embodiments, the lines of communication between the first and second chassis and between the first and third chassis may be indistinct or shared.

Advantages of the Method

As indicated in the Description of the Related Art, some prior methods allowed for two chassis to be coupled via cables. However, such cables can require considerable time and effort by a user connecting the two chassis and can result in misconfiguration. Additionally, cables can become tangled and messy and cause signal degradation and latency problems (e.g., due to the length of cable involved). Using a short, rigid connection, such as in embodiments described above, overcomes all of these problems. More specifically, signal degradation and latency problems do not occur significantly when using appropriate rigid connections, such as circuit boards. Additionally, connecting a plurality of chassis may allow for an arbitrarily long backplane, e.g., allowing for the creation of much larger matrices and multiplexers. Thus, the coupling elements and rigid connection allows bus signals (e.g. analog bus signals) (and/or other signals) to propagate seamlessly to adjacent chassis without the need for cabling. In some embodiments, the rigid connection may provide increased bandwidth when compared to typical wiring solutions.

Additionally, by coupling chassis using a rigid connection, effectively larger chassis can be created without introducing separate design cycles for such larger chassis. For example, combining three different 4 slot chassis to effectively create a 12 slot chassis does not require a manufacturing company to design and produce a unique 12 slot chassis.

Furthermore, the rigid connections between the different chassis may provide a unique ability to test and debug systems. For example, the rigid connection may provide a visible connection which provides direct access to signals between chassis, thereby providing for the ability to measure or determine signal characteristics (e.g., directionality), e.g., using a DMM or other signal analyzer. In one embodiment, instead of a rigid connection connecting two chassis, it is possible to use measurement circuitry to test or measure backplane signals sent on the backplane of a chassis. For example, a measurement PCB could be mated with a coupling element of a first chassis in order to test or measure backplane signals of the first chassis. Thus, the measurement PCB could include circuitry for performing testing or measurement of these backplane signals.

In some embodiments, the rigid connection may also be able to indicate signal presence (e.g., with an LED or other indicator), e.g., for debugging purposes. Additionally, using multiple individual busses within a single overall platform such as PXI provides a hereto unavailable means to help debug large switching systems.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A first chassis, comprising:
   a housing defining one or more slots and comprising an exterior;
   a first backplane comprised in the housing, wherein the first backplane is configured to receive one or more cards in the one or more slots; and
   a first coupling element comprised on the exterior of the housing and electrically coupled to the first backplane, wherein the first coupling element is configured to mate with a first rigid connection in order to convey communication through the first rigid connection between the first backplane of the first chassis and a second backplane of a second chassis, and wherein a second coupling element of the second chassis also mates with the first rigid connection;
   a third coupling element comprised on the exterior of the housing and electrically coupled to the first backplane, wherein the third coupling element is configured to mate with a second rigid connection in order to convey communication through the second rigid connection between the first backplane of the first chassis and a third backplane of a third chassis, and wherein a fourth coupling element of the third chassis also mates with the second rigid connection.

2. The system of claim 1,
   wherein the first rigid connection comprises a circuit board.

3. The system of claim 1,
   wherein the first rigid connection is configured to convey analog bus signals between the first and second backplane.

4. A system, comprising:
   a first chassis, comprising:
      a first housing defining a first one or more slots and comprising a first exterior;
      a first backplane comprised in the first housing, wherein the first backplane is configured to receive a first one or more cards in the first one or more slots; and
      a first coupling element comprised on the first exterior of the first housing and electrically coupled to the first backplane;
   a second chassis, comprising:
      a second housing defining a second one or more slots and comprising a second exterior;
      a second backplane comprised in the second housing, wherein the second backplane is configured to receive a second one or more cards in the second one or more slots; and
      a second coupling element comprised on the second exterior of the second housing and electrically coupled to the second backplane;
   a first rigid connection, wherein the first rigid connection is configured to mate with the first coupling element and to mate with the second coupling element to connect the first backplane of the first chassis and the second backplane of the second chassis, wherein the first rigid connection is configured to convey communication between the first backplane of the first chassis and the second backplane of the second chassis;
   a third chassis, comprising:
      a third housing defining a third one or more slots and comprising a third exterior;
      a third backplane comprised in the third housing, wherein the third backplane is configured to receive a third one or more cards in the third one or more slots; and
      a third coupling element comprised on the third exterior of the third housing and electrically coupled to the third backplane; and
   wherein the first chassis comprises a fourth coupling element comprised on the first exterior of the first housing and electrically coupled to the first backplane; and
   a second rigid connection, wherein the second rigid connection is configured to mate with the fourth coupling element and to mate with the third coupling element to connect the first backplane of the first chassis and the third backplane of the third chassis, wherein the second rigid connection is configured to convey communication between the first backplane of the first chassis and the third backplane of the third chassis.

5. The system of claim 4,
   wherein the first rigid connection comprises a circuit board.

6. The system of claim 4,
   wherein the first rigid connection comprises a printed circuit board.

7. The system of claim 4,
   wherein the rigid connection is configured to receive and transmit bus signals between the first and second backplane.

8. The system of claim 4,
   wherein the rigid connection is configured to convey analog bus signals between the first and second backplane.

9. A method for coupling a plurality of chassis, comprising:
   mating a first coupling element of a first chassis with a first rigid connection, wherein the first coupling element is positioned on an exterior housing of the first chassis;
   mating a second coupling element of a second chassis with the first rigid connection, wherein the second coupling element is positioned on an exterior housing of the second chassis;

wherein said connecting the first chassis and the second chassis allows the first and second chassis to communicate mating a third coupling element of the first chassis with a second rigid connection, wherein the third coupling element is positioned on an exterior housing of the first chassis;

mating a fourth coupling element of a third chassis with the second rigid connection, wherein the fourth coupling element is positioned on an exterior housing of the third chassis;

wherein said connecting the first chassis and the third chassis allows the first and third chassis to communicate.

10. The method of claim 9,
wherein the first rigid connector comprises a circuit board.

11. The method of claim 9,
wherein the first rigid connector comprises a printed circuit board.

12. The method of claim 9, further comprising:
a first backplane of the first chassis communicating with a second backplane of the second chassis over the first rigid connector.

13. The method of claim 12,
wherein said communicating comprises transmitting one or more bus signals over the first rigid connector.

14. The method of claim 12,
wherein said communicating comprises transmitting one or more analog bus signals over the first rigid connector.

15. The method of claim 9, wherein said connecting the first chassis and the third chassis allows the first, second, and third chassis to communicate.

16. A method for coupling a plurality of chassis, comprising:
connecting a first backplane of a first chassis with a second backplane of a second chassis, wherein the first backplane comprises a first coupling element, wherein the second backplane comprises a second coupling element, and wherein said connecting comprises:
coupling the first coupling element with the second coupling element using a first rigid connection;
wherein said connecting the first backplane of the first chassis and the second backplane of the second chassis allows the first and second chassis to communicates;
connecting the first backplane of the first chassis with a third backplane of a third chassis, wherein the first backplane comprises a third coupling element, wherein the third backplane comprises a fourth coupling element, and wherein said connecting comprises:
coupling the third coupling element with the fourth coupling element using a second rigid connection;
wherein said connecting the first backplane of the first chassis and the third backplane of the third chassis allows the first and third chassis to communicate.

17. The method of claim 16,
wherein the first rigid connection comprises a circuit board.

18. The method of claim 16,
wherein said connecting the first backplane of the first chassis and the second backplane of the second chassis allows the first and second chassis to communicate one or more bus signals over the first rigid connection.

19. The method of claim 16,
wherein said connecting the first backplane of the first chassis and the second backplane of the second chassis allows the first and second chassis to communicate one or more analog bus signals over the first rigid connection.

20. A first chassis, comprising:
a housing defining one or more slots and comprising an exterior;
a first backplane comprised in the housing, wherein the first backplane is configured to receive one or more cards in the one or more slots;
a first coupling element comprised on the exterior of the housing and electrically coupled to the first backplane, wherein the first coupling element is configured to mate with a second coupling element of a second chassis in order to convey communication between the first backplane of the first chassis and a second backplane of the second chassis; and
a third coupling element comprised on the exterior of the housing and electrically coupled to the first backplane, wherein the third coupling element is configured to mate with a fourth coupling element of a third chassis in order to convey communication between the first backplane of the first chassis and a third backplane of the third chassis.

21. The system of claim 20, wherein the communication between the first and second backplane comprises one or more analog bus signals.

* * * * *